(12) United States Patent
Ishikawa et al.

(10) Patent No.: US 7,005,644 B2
(45) Date of Patent: Feb. 28, 2006

(54) THERMAL INFRARED DETECTOR AND INFRARED FOCAL PLANE ARRAY

(75) Inventors: Tomohiro Ishikawa, Tokyo (JP); Masashi Ueno, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 163 days.

(21) Appl. No.: 10/658,407

(22) Filed: Sep. 10, 2003

(65) Prior Publication Data

US 2004/0200962 A1 Oct. 14, 2004

(30) Foreign Application Priority Data

Apr. 11, 2003 (JP) .......................... P 2003-107677

(51) Int. Cl.
*G01J 1/02* (2006.01)
(52) U.S. Cl. ............................... 250/339.04; 250/338.4
(58) Field of Classification Search ........... 250/339.04, 250/338.4, 338.1, 332, 352, 338.2, 338.3; 438/72, 96
See application file for complete search history.

(56) References Cited

U.S. PATENT DOCUMENTS

| | | |
|---|---|---|
| 5,196,703 A | 3/1993 | Keenan |
| 5,286,976 A | 2/1994 | Cole |
| 5,760,398 A | 6/1998 | Blackwell et al. |
| 5,977,603 A | 11/1999 | Ishikawa |
| 6,144,030 A | 11/2000 | Ray et al. |
| 6,294,787 B1 * | 9/2001 | Schieferdecker et al. ... 250/349 |
| 6,465,784 B1 | 10/2002 | Kimata |
| 6,483,111 B1 * | 11/2002 | Ishikawa et al. .......... 250/338.4 |
| 6,489,615 B1 * | 12/2002 | Bluzer ..................... 250/338.1 |
| 6,552,344 B1 | 4/2003 | Sone et al. |
| 6,690,014 B1 * | 2/2004 | Gooch et al. ............ 250/338.4 |
| 2001/0003356 A1 * | 6/2001 | Yon et al. ................ 250/338.1 |
| 2002/0039838 A1 * | 4/2002 | Iida et al. .................. 438/689 |
| 2002/0179837 A1 * | 12/2002 | Ray ........................ 250/338.1 |
| 2003/0141453 A1 * | 7/2003 | Reed et al. ............... 250/338.1 |

FOREIGN PATENT DOCUMENTS

JP 2000-321125 11/2000

OTHER PUBLICATIONS

Ishikawa et al., "Low-cost 320 x 240 Uncooled IRFPA Using Conventional Silicon IC Process", *SPIE Conference on Infrared Tech. Applications XXV*, Apr. 1999, pp. 556-564, vol. 3698, FL.

* cited by examiner

*Primary Examiner*—Otilia Gabor
(74) *Attorney, Agent, or Firm*—Leydig, Voit & Mayer, Ltd.

(57) ABSTRACT

A thermal infrared detector includes a substrate; a temperature sensor having electrical characteristics changed in accordance with changes in temperature caused by infrared absorption; heat-insulating supporting legs supporting and thermally insulating the temperature sensor and serving as signal lines for reading out electrical signals from the temperature sensor; and an infrared absorption layer in thermal contact the temperature sensor. Each of the temperature sensor, the heat-insulating supporting legs, and the infrared absorption layer is in a different plane and the planes are spatially separated from each other.

13 Claims, 14 Drawing Sheets

THERMAL INFRARED DETECTOR AND INFRARED FOCAL PLANE ARRAY

BACKGROUND OF THE INVENTION

1. Field of the Invention

The present invention relates to a thermal infrared detector in which infrared rays are detected by conversion to heat and to an infrared focal plane array including such sensors aligned in a two-dimensional arrangement, and particularly to a structure of a thermal infrared detector detecting infrared rays with high sensitivity and low noise.

2. Description of the Background Art

Infrared focal plane arrays catch sight of objects that do not stimulate human sight and instantly measure temperatures of objects from distant places without contact. Such arrays are being used in diverse ways in a wide variety of industrial fields, for measuring and controlling manufacturing lines, as medical and diagnostic devices, and devices detecting humans. A general infrared focal plane array includes infrared detectors arranged in a two-dimensional matrix, and a signal read-out circuit around the array for reading signals from the detectors.

Infrared detectors that are used in infrared focal plane arrays may be generally classified by their principles: those of the quantum type in which infrared rays as photons are utilized; and those of the thermal type in which thermal actions of infrared rays are utilized. While the quantum type have an advantage in high sensitivity and rapid response, the entire device is complicated and costly since detectors need to be cooled to around −200° C. The thermal type exhibit inferior response speed, but they need not be cooled and may operate at room temperature. Therefore, infrared focal plane arrays employing thermal type infrared detectors are the trend in general purpose use.

In thermal type infrared detectors, changes in temperature caused through absorption of infrared rays irradiated from a material are converted into electric signals by means of temperature sensors in which electric characteristics are changed through temperature. Among known thermal type infrared detectors that have been developed in the past, there are some that employ resistors (that is, resistance bolometer films), which ohmic values changed in accordance with temperature, as temperature sensors (for instance, U.S. Pat. No. 5,286,976, Japanese Patent Laid-Open Publication No. 5-206526, U.S. Pat. No. 6,144,030), or some which employ semiconductor elements such as diodes or transistors as temperature sensors (for instance, U.S. Pat. No. 5,977,603, U.S. Pat. No. 6,465,784, Japanese Patent Laid-Open Publication No. 2000-321125, T. Ishikawa, M. Ueno, K. Endo, Y. Nakaki "Low Cost 320 by 240 Non-cooling IRFPA Employing Conventional Silicon IC Processes", Part of the SPIE Conference on Infrared Technology and Applications XXV, USA, April 1999, SPIE Vol. 3698, pp. 556–564). Since such thermal infrared detectors may be formed on semiconductor substrates made of, for instance, mono-crystalline silicon, detectors and signal read-out circuits may be advantageously formed in a simultaneous manner within the same semiconductor manufacturing lines.

In general thermal type infrared detectors in which bolometer films are employed as temperature sensors, bolometer films that are to serve as the temperature sensors are of bridge arrangement in which they are lifted upward of the substrate by means of thin film supporting legs exhibiting high thermal resistance (for instance, FIG. 1 of U.S. Pat. No. 5,286,976 or FIG. 2 of Japanese Patent Laid-Open Publication No. 5-206526). Bolometer films are heat-insulated with respect to the substrate through the supporting legs while they are electrically connected with a signal read-out circuit formed on a substrate downward of the bridge through wirings within the supporting legs. Due to this arrangement, when infrared ray enters thereto, the change in temperature of the bolometer films is caused and the resistance of the bolometer films is changed owing to changes in temperature. The change in the resistance may be output as changes in voltage or current.

Among thermal type infrared detectors employing semiconductor elements such as diodes or transistors as temperature sensors, some are known that diodes or like are formed on a polycrystalline silicon film grown on semiconductor substrates (for instance, U.S. Pat. No. 5,977,603) or that diodes are formed on an. SOI substrates (for instance, Ishikawa et al., Part of the SPIE Conference on Infrared Technology and Applications XXV, USA, April 1999, SPIE Vol. 3698, pp. 556–564). In both cases, signal read-out circuits and temperature sensors may be formed simultaneously in ordinary semiconductor processes so that it is possible to obtain infrared detectors suitable for mass production at high yields.

When forming temperature sensors such as diodes on to polycrystalline silicon films, the diodes that are to serve as the temperature sensors will be arranged in a bridge-like conformation similarly to a bolometer type in which the diodes are lifted upward of the substrate through supporting legs having high thermal resistivity (see FIG. 1 of U.S. Pat. No. 5,977,603). When forming temperature sensors such as diodes onto mono-crystalline thin films of SOI substrates, the temperature sensors will be arranged such that they are supported by supporting legs, which are formed by hollowing out a part of the substrate under the insulating thin film.

In an infrared focal plane array in which such thermal type infrared detectors are arranged two-dimensionally as pixels, the size of each single infrared detector is limited. The fill factor, which is the area ratio of an infrared absorbing region occupying a pixel area (that is, area of respective infrared detectors), should be made as large possible for the purpose of achieving high sensitivity. On the other hand, for improving the sensitivity with respect to infrared rays, it is also necessary to make the supporting legs long enough to improve heat-insulating characteristics of the temperature sensors. For this purpose, various methods have been studied for achieving high sensitivity of thermal type infrared detectors by improving the fill factor and securing a height for the supporting legs.

For instance, U.S. Pat. No. 6,144,030 discloses a two-layered arrangement in which a bolometer film and an infrared absorbing film are integrally formed as a broad region and thin film supporting legs of high thermal resistance extend downward. This structure is effective for bolometers since it is possible to secure the fill factor while simultaneously making the supporting legs longer than usual.

According to U.S. Pat. No. 6,465,784 and Japanese Patent Laid-Open Publication No. 2000-321125, fill factors of the infrared detectors are improved by employing an arrangement in which an infrared absorbing film, which is thermally connected to diodes that are to function as temperature sensors, is hanging over the supporting legs in a parasol-like manner.

In U.S. Pat. No. 5,760,398, fill factors are substantially improved by providing a wide concave mirror under the temperature sensors and the supporting legs, wherein infrared rays reflected by the concave mirror are focused onto the temperature sensors (see FIG. 2 and FIG. 3 of U.S. Pat. No. 5,760,398).

SUMMARY OF THE INVENTION

However, with demands for high-resolution infrared focal plane arrays and reductions in camera costs, further reduction of the pixel size, i.e. the size of the thermal type infrared detectors is required.

Therefore, it is an object of the present invention to provide a thermal type infrared detector of novel arrangement exhibiting high sensitivity and low noise and an infrared focal plane array using the same.

According to the present invention, we provide a thermal type infrared detector comprising: a substrate; a temperature sensor of which electric characteristics are changed in accordance with changes in temperature caused through infrared absorption; heat-insulating supporting legs for supporting the temperature sensor in a heat-insulating manner and serving as signal lines for reading out electric signals from the temperature sensor; and an infrared absorption layer having thermal contact with the temperature sensors, wherein each of the temperature sensor, the heat-insulating supporting legs and the infrared absorption layer is formed in different planes that are spatially apart from each other.

BRIEF DESCRIPTION THE DRAWINGS

The above and other objectives and features of the present invention will become more apparent from description of a preferred embodiment thereof with reference to the accompanying drawings, throughout which like parts are designated by like reference numerals, and wherein.

DESCRIPTION OF THE PREFERRED EMBODIMENTS

This application is based on applications No. 2003-107677 filed in Japan, the content of which is incorporated herein by reference.

Embodiment 1

Figure 1:
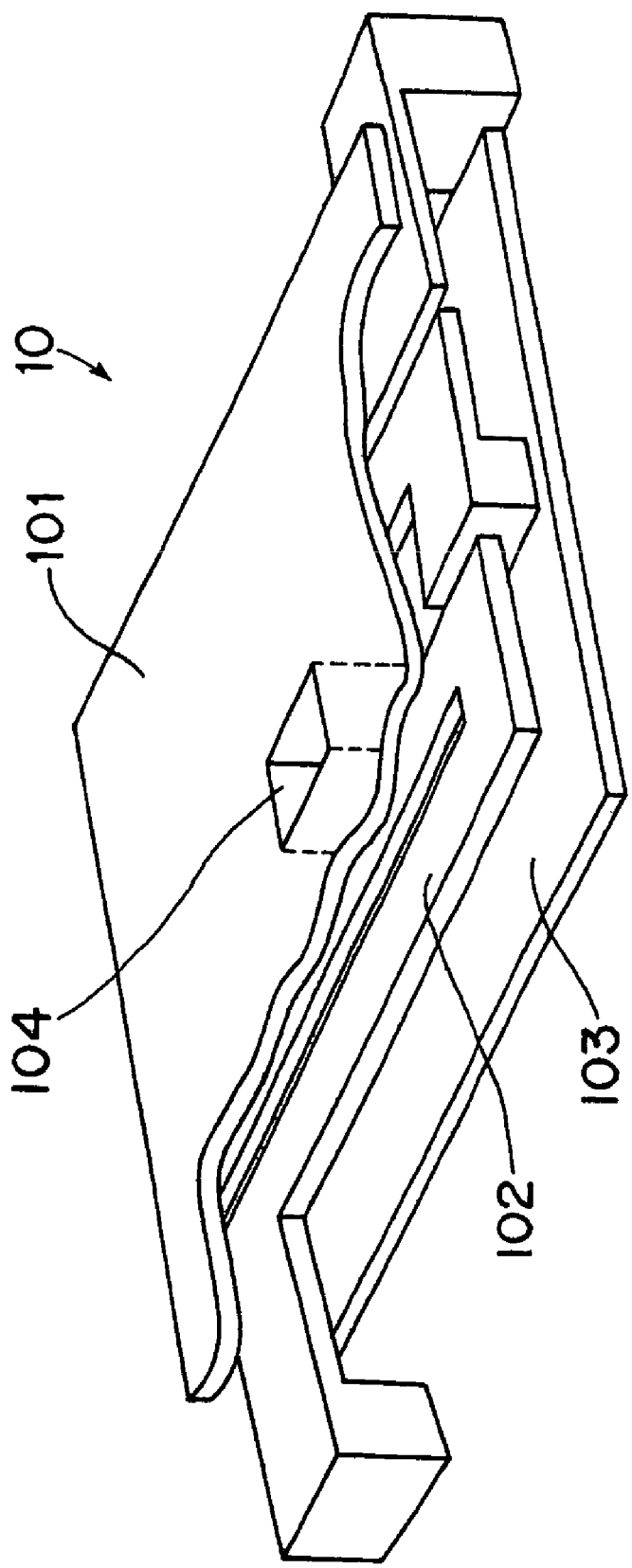
FIG. 1 is a perspective view illustrating a thermal type infrared detector according to a first embodiment of the present invention.
Figure 2:
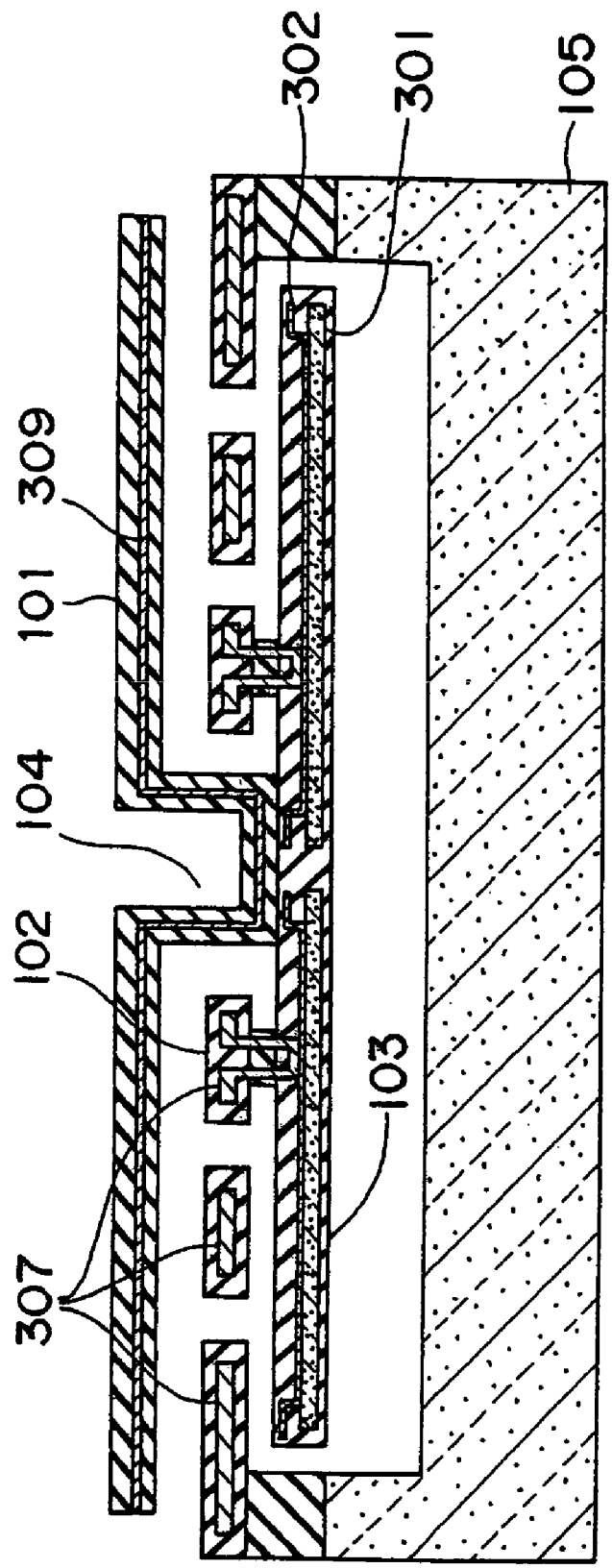
FIG. 2 is a cross-sectional view illustrating the thermal type infrared detector according to the first embodiment of the present invention.

FIG. 1 is a perspective view illustrating a thermal type infrared detector according to a first embodiment of the present invention, and FIG. 2 is a schematic cross-sectional view thereof illustrating its cross-section in schematic form. The thermal type infrared detector 10 includes a substrate 105 of mono-crystalline silicon, a temperature sensor 103 which electric characteristics are changed in accordance with changes in temperature caused through infrared absorption, two heat-insulating supporting legs 102 for supporting the temperature sensor 103 in a heat-insulating manner and serving as signal lines for reading out electric signals from the temperature sensor 103, and an infrared absorption portion 101 formed to have thermal contact with the temperature sensor 103 via a supporting pillar 104. A portion of substrate 105 downward of the temperature sensor 103 is removed so as to form a cavity 107 so that the temperature sensor 103 is thermally insulated from the substrate 105.

The thermal type infrared detector 10 is formed in a three-layered arrangement in which the infrared absorption portion 101, the heat-insulating supporting legs 102 and the temperature sensor 103 are laminated in this order when seen from a direction of incidence of infrared light, and they are formed within different planes with each other, which planes are spatially apart from each other. More particularly, cavities for thermal separation from each other are formed between the infrared absorption portion 101 and the heat-insulating supporting legs 102 as well as between the heat-insulating supporting legs 102 and the temperature sensor 103. The infrared absorption portion 101 and the temperature sensors 103 are thermally connected with each other by means of the supporting pillar 104 formed by deforming a part of the planar infrared absorption portion 101 in a concave manner. Each of the two heat-insulating supporting legs 102 are electrically connected to the temperature sensor 103 at connecting portions formed at their terminal ends.

It should be noted that in the present description, "thermal" connection between two members indicates a condition in which two members are in contact with each other either directly or with a thermally conductive substance being interposed between. "Electric" connection between two members indicates a condition in which conductive materials contained in the two members are in contact with each other either directly or with a conductive substance being interposed between.

Infrared rays entered from above the substrate 105 are absorbed by the infrared absorption portion 101 located in the topmost layer, and heat generated through the absorption is transmitted to the temperature sensor 103 via the supporting pillar 104. Changes in electric characteristics owing to the change in temperature of the temperature sensor 103 are read out by a signal read-out circuit formed at the silicon substrate 105 through metallic wirings 307 within the heat-insulating supporting legs 102.

According to the thermal type infrared detector 10 of the present invention, maximum areas may be secured for the respective regions independent from each other. Therefore, it is possible to fill three different requirements simultaneously: to enlarge the fill factor that determines the absorption area of infrared rays; to make the supporting legs, which determines the thermal resistance, be long; and to expanding the area for the temperature sensor. By expanding the area for the temperature sensor 1/f noise can be reduced. It is accordingly possible to achieve high sensitivity and low noise and thus to remarkably improve detection performances of infrared rays.

The mechanism of the noise-reduction effect is as follows. Characteristics of infrared detectors are determined by a signal-to-noise ratio (S/N ratio). Noises of a infrared detector include components of two kinds: one is determined by properties of material and another is determined by structure or processes. The former noise includes, for example, Johnson noise in case with bolometers and shot noise in case of diodes. The latter noise includes, for example, 1/f noise. The 1/f noise is caused by an irregular capture and discharge of carriers through carrier capture levels generated within temperature sensors. When carriers are irregularly captured and discharged, the number of carriers, which form current flow, shows time variations. The 1/f noise is therefore correlated with the volume of a portion in which the carrier capture level is present, which is generally the entire volume of the temperature sensors. As such, the larger the volume of the temperature sensors is, the more the 1/f noise may be reduced. While the number of capture and discharge of carriers is increased by increasing the volume of the temperature sensors, their variations will be mutually averaged and the 1/f noise will be reduced.

According to the thermal type infrared detector 10, it is possible to form the infrared absorption portion 101, the heat-insulating supporting legs 102 and the temperature sensor 103 such that the S/N ratio of read-out signals becomes as high as possible. For instance, when seen from the direction of incidence of light, it is preferable that the temperature sensor 103 and the infrared absorption portion 101 are formed in a region that overlaps with the heat-insulating supporting legs 102. It is even more preferable that the temperature sensor 103 and the infrared absorption portion 101 are broadly formed to cover substantially the entire surface of the heat-insulating supporting legs 102. It is also preferable that the heat-insulating supporting legs 102 themselves are formed to cover a broad area so as to elongate the length of the supporting legs.

In this embodiment, the infrared absorption portion 101 is formed to substantially cover the entire surface of the thermal type infrared detector 10 such that the fill factor, which determines the absorption area of infrared rays, comes to maximum. The heat-insulating supporting legs 102 extend over substantially the entire surface of the thermal type infrared detector 10 so that the supporting leg length, which determines the thermal resistance, becomes as long as possible. The heat-insulating supporting legs 102 can be folded for a desired number of times, because the temperature sensor 103 or the infrared absorption portion 101 are not formed on the same layer. Thus, it is possible to obtain an extremely high thermal resistance. A large area is also secured for the temperature sensor 103 independently from the heat-insulating supporting legs 102 or the infrared absorption portion 101. By forming the temperature sensor 103 over substantially the entire surface of the thermal type infrared detector 10, fluctuations in the number of carriers depending on the carrier capture levels in the temperature sensor 103 can be averaged, which thereby reduce the 1/f noise. It should be noted that the area for the temperature sensor 103 and that for the infrared absorption film 101 are substantially identical in the present embodiment.

In this manner, the S/N ratio of the infrared detector 10 may be maintained high even when the thermal type infrared detectors has been downsized. The present invention is therefore particularly effective when infrared detectors are integrated in a two-dimensional manner wherein individual detector areas are limited.

Moreover, according to the present invention, shapes and process conditions of the infrared absorption layer, the temperature sensor and the supporting legs can be optimized individually. In other words, degrees of freedom of manufacturing processes and structural design will become higher. For instance, it is possible to improve the electric characteristics of the temperature sensor 103 by a heat treatment at high temperature, while using metal materials in the heat-insulating supporting legs 102 and in the infrared absorption portion 101. Performing heat treatment at high temperature is also advantageous in that characteristics of the sensor is stabilized and that electric contacts in the device is improved. Further, heat treatment at a temperature exceeding 500° C. is inevitable for obtaining diodes or transistors that are manufactured by injecting dopants to silicon. When manufacturing an infrared focal plane array on a SOI substrate, it is possible to form the temperature sensor 103 simultaneously with the signal read-out circuit.

Respective component members of the thermal type infrared detector will now be explained in details.

The infrared absorption portion 101 is comprised with an infrared absorption film 309 and an insulating protection film. The insulating protection film is for protecting the infrared absorption film 309 from the external environment and for improving its mechanical strength. The infrared absorption film 309 shall be made of a material that exhibits a high infrared absorption rate, such as, metal, metal compounds, carbon or ceramic. It is also possible to combine these materials through methods such as lamination. When the infrared absorption film is made of metal or a metal compound, it is preferable to use titanium, chrome, nichrome, titanium nitride or vanadium nitride. The absorption rate of infrared rays may be improved by suitably selecting the electric resistivity or the film thickness of the metal or metal compound film. When the ohmic value per unit area, which is referred to as the sheet resistance, is selected to be approximately 100 Ω to 1 kΩ, the absorption rate of infrared rays is improved. It is also possible to use a material exhibiting extremely high absorption rate of infrared rays such as gold black as the infrared absorption film. As for the insulating protection film, $SiO_2$ or silicon nitride is favorably used. It should be noted that when the infrared absorption film 309 exhibits sufficient mechanical strength by itself, the insulating protection film might be omitted.

The infrared absorption portion 101 may be of an arrangement in which an infrared absorption film, an insulating film, and an infrared reflection film are laminated in this order when seen from the direction of incidence of infrared rays. In this case, it is preferable to employ a material exhibiting high infrared reflectivity, such as, aluminum, titanium, a compound thereof, copper or gold as the infrared reflection film. It is also possible to form a resonance space between the infrared absorption film and the infrared reflection film in which the optical distance between both members is defined to be about ¼ of the wavelength of infrared rays.

Figure 17:
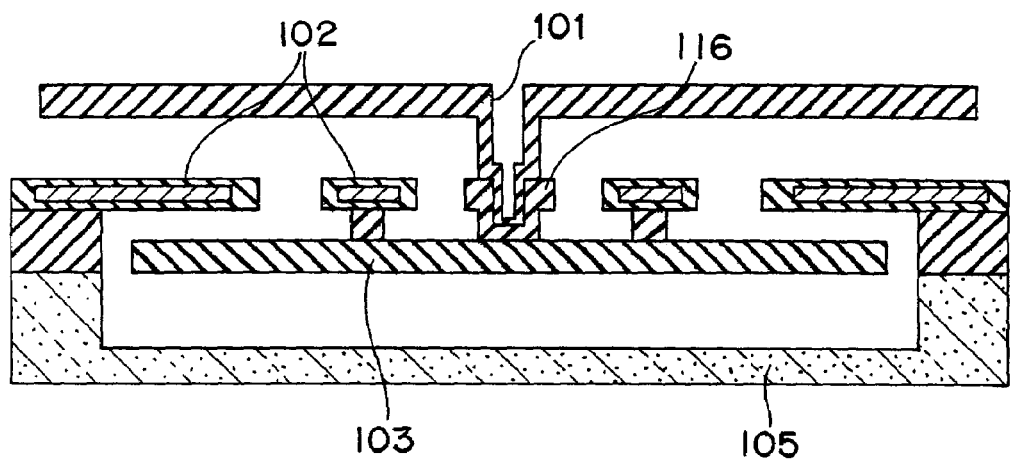
FIG. 17 is a cross-sectional view illustrating a method for manufacturing a thermal type infrared detector according to another embodiment of the present invention.

While the present embodiment has been explained with a case in which the infrared absorption portion 101 itself is in contact with the temperature sensor 103, it would be suffice that the infrared absorption portion 101 is in thermal contact with the temperature sensor 103. For instance, it is possible to employ an arrangement as illustrated in FIG. 17 in which the infrared absorption portion 101 is in contact with the temperature sensor 103 with an intermediate layer 116 comprised of a thermally conductive material being interposed between. In this case, any material may be used as long as the material exhibits thermal conductivity to such an extent that heat generated at the infrared absorption portion 101 is smoothly transmitted to the temperature sensor 103.

In the present embodiment, the temperature sensor 103 is comprised of p-n junction diodes serially connected to each other. Changes in temperature of the electric characteristics of these p-n junction diodes may be read out as signals through wirings 307 formed in the heat-insulating supporting legs 102. In general, larger the potential barrier of the elements constituting the temperature sensor becomes, larger the resistance temperature coefficient and the sensitivity as the infrared detector will be. However, with the increment of the sensitivity, the resistance of the sensor is also increased and a compatibility with the signal read-out circuit may be lost. By comprising the temperature sensor 103 of serially connected diodes and by setting the number of connection to be optimum, it is possible to achieve compatibility with the signal read-out circuit and to improve the sensitivity of the infrared detector. In case of conventional thermal type infrared detectors, it was difficult to obtain a required number of connection of diodes when the detector size became smaller accompanying shrinks in pixel size of an infrared focal plane array. According to the present invention, a required number of connections may be easily secured since diodes may be formed over substantially the entire surface of the detector.

Figure 3:
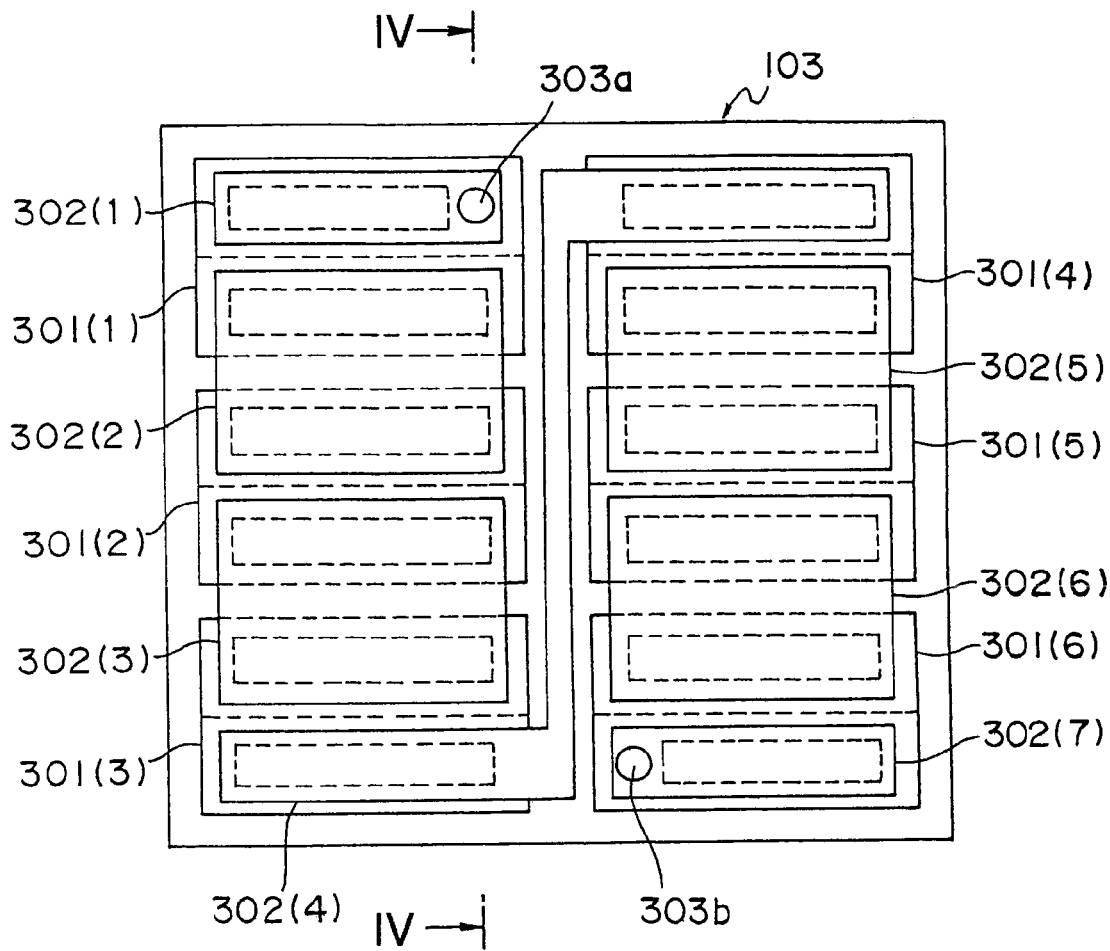
FIG. 3 is a plan view illustrating a temperature sensor of the thermal type infrared detector according to the first embodiment of the present invention.
Figure 4:
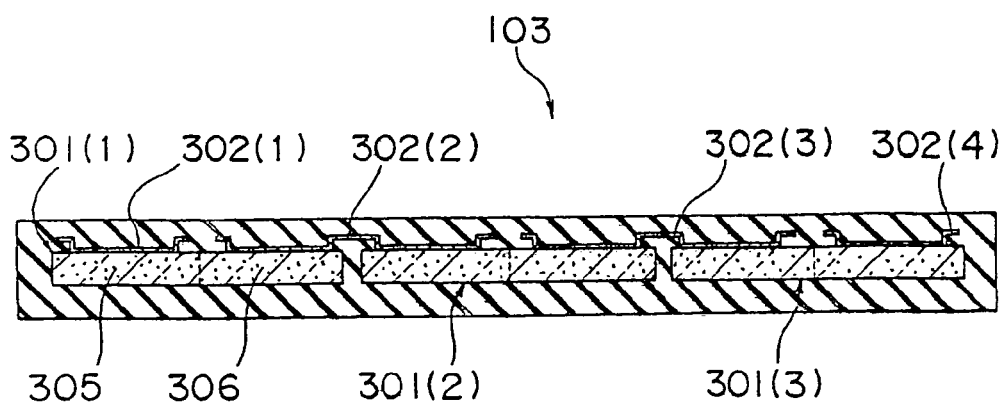
FIG. 4 is a cross-sectional view seen from section IV—IV in FIG. 3.

FIG. 3 is a plan view illustrating the temperature sensor 103 employing p-n junction diodes, and FIG. 4 is a cross-sectional view seen from section A–A' in FIG. 3. In the example as illustrated in FIG. 3, six p-n junction diodes 301(1) to 301 (6) (hereinafter generally referred to as "diodes 301") are arranged in two rows, by threes on each side. The respective p-n junction diodes 301 are serially connected by using seven wiring electrodes 302(1) to 302 (7) (hereinafter generally referred to as wiring electrodes 302). The fourth wiring electrode 302(4) is arranged in a crank-like manner that crosses the center of the rectangular detector for connecting the last diode 301(3) in the first row with the first diode 301(4) in the second row. The first wiring electrode 302(1) and the last wiring electrode 302(7) are respectively formed with contact portions 303*a* and 303*b* for connection with the heat-insulating supporting legs 102. The wiring electrodes 302 are preferably made of TiN, Ti, Co, Pt, WSi or a laminated structure thereof.

The p-n junction diodes 301 of the present embodiment are of lateral arrangement as illustrated in FIG. 4 in which p-type regions 305 and n-type regions 306 are connected within the same plane in lateral directions. While not illustrated in the drawings, it is preferable that contact regions of the wiring electrodes 302 and the diodes 301 are of a high dopant density to such an extent with which favorable ohmic contacts are formed. In the present embodiment, it is preferable to form the p-n junction diodes 301 within a mono-crystalline silicon thin film of the SOI substrate. An SOI substrate is a substrate in which a mono-crystalline silicon thin film is formed onto a mono-crystalline silicon substrate with an insulating thin film being interposed between. In ordinary semiconductor processes, a silicon layer formed on a mono-crystalline silicon substrate will be polycrystalline silicon. When using polycrystalline silicon, 1/f noise will easy be generated since the crystalline grain boundary will be the capture level of carriers. By forming diodes on the mono-crystalline silicon thin film of the SOI substrate, it is possible to achieve lower noise.

Figure 5:
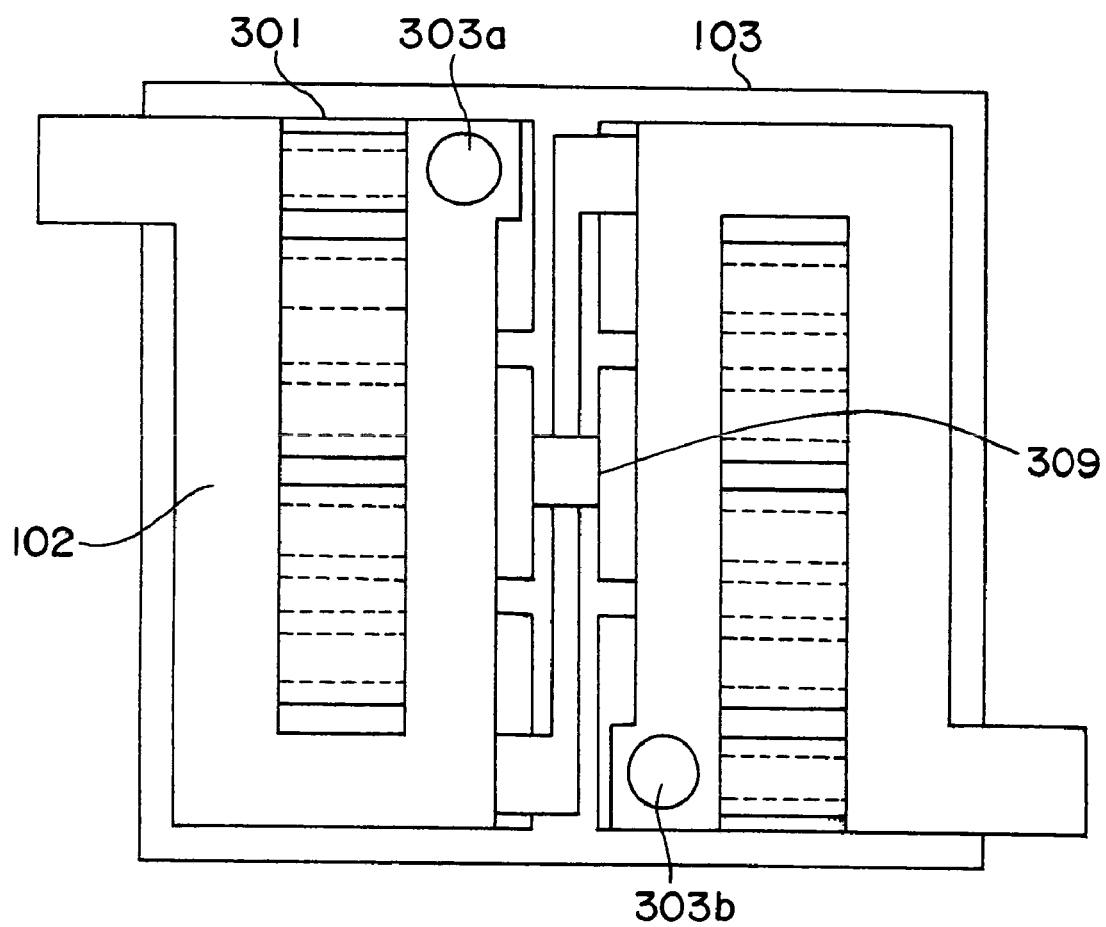
FIG. 5 is a plan view illustrating the temperature sensor and heat-insulating supporting legs of the thermal type infrared detector according to the first embodiment of the present invention.

FIG. 5 is a plan view illustrating the heat-insulating supporting leg 102. As illustrated in FIG. 5, the serially connected diodes 301 are connected to the wirings within the heat-insulating supporting legs 102 via the contact portions 303*a* and 303*b* on the wiring electrodes 302 connected to both ends thereof. More particularly, the entire temperature sensor 103 comprised of a plurality of diodes 301 is suspended from the heat-insulating supporting legs 102 at the contact portions 303*a* and 303*b*. The supporting pillar 309 is connected to substantially the center of the temperature sensor 103, wherein the infrared absorption portion 101 (not shown) is connected via the supporting pillar 309.

Since the upper portion of the temperature sensor 103 may be folded by an unlimited number of times, extremely high heat resistance for the heat-insulating supporting legs 102 may be achieved. For instance, as shown in FIG. 5, the two heat-insulating supporting legs 102 respectively extend in a direction parallel to the sides of the thermal type infrared detector 10 while repeatedly being folded over. The legs 102 start from The corner portions located on diagonal lines of the rectangular thermal type infrared detector 10 and are connected to the temperature sensor 103 at their terminal end portions located proximate to central portions of the sides of the thermal type infrared detector 10. It should be noted that the heat-insulating supporting legs 102 might be of an arbitrary shape as long as they allow elongation of the supporting leg lengths, and they may have various shapes other than the shape as illustrated in FIG. 5. For instance, a spiral-like shape that runs along the outer periphery of the rectangular detector.

The heat-insulating supporting legs 102 are preferably arranged in which the periphery of metallic wirings such as aluminum, titanium or tungsten is covered by an insulating thin film made of, for instance, $SiO_2$ or SiN.

Figure 6A:
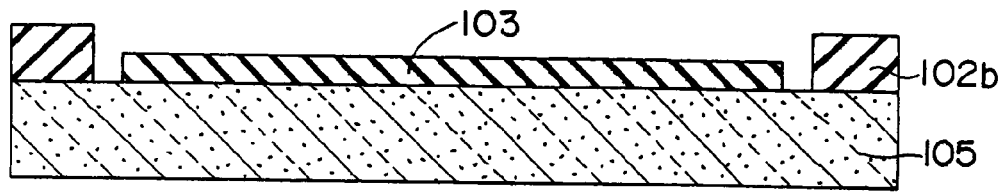
FIG. 6A to FIG. 6E are views illustrating a method for manufacturing the thermal type infrared detector according to the first embodiment of the present invention.

The method for manufacturing the thermal type infrared detector according to the present embodiment will now be explained. FIGS. 6A to 6E are process views illustrating a method for manufacturing a thermal type infrared detector. It should be noted that the internal arrangements of the temperature sensor 103, the heat-insulating supporting legs 102 and the infrared absorption portion 101 are omitted in FIG. 6 for simplification of the drawings. As shown in FIG. 6A, the temperature sensor 103 is formed onto the mono-crystalline silicon substrate 105. The temperature sensor 103 is comprised of p-n junction diodes serially connected to each other. The p-n junction diodes are enveloped with an insulating material such as $SiO_2$ or SiN such that they are not damaged through sacrifice layer etching that is performed at a later stage.

Figure 7A:
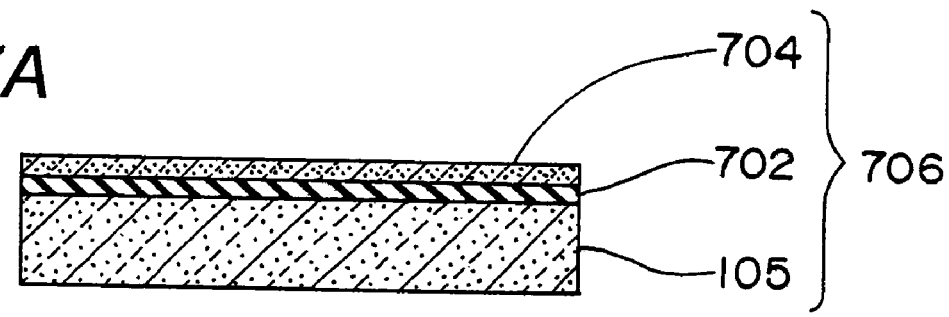
FIG. 7A to FIG. 7D are views illustrating a method for forming temperature sensors onto an SOI substrate in the first embodiment of the present invention.
Figure 7B:
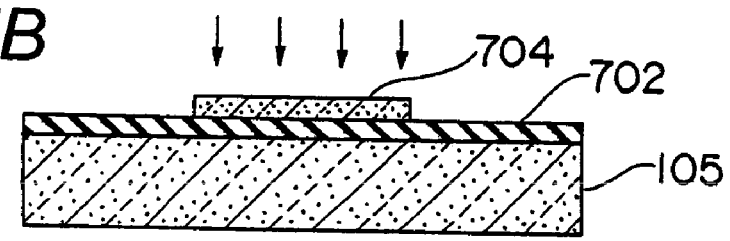
Figure 7C:
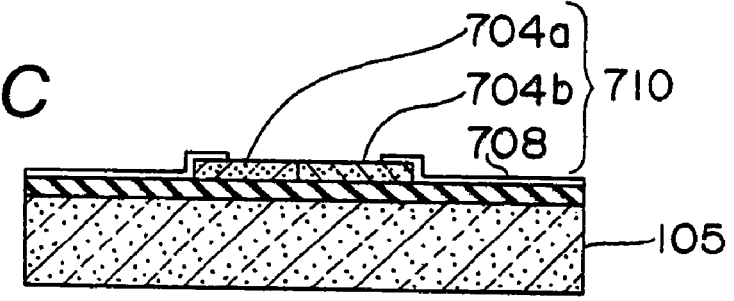
Figure 7D:
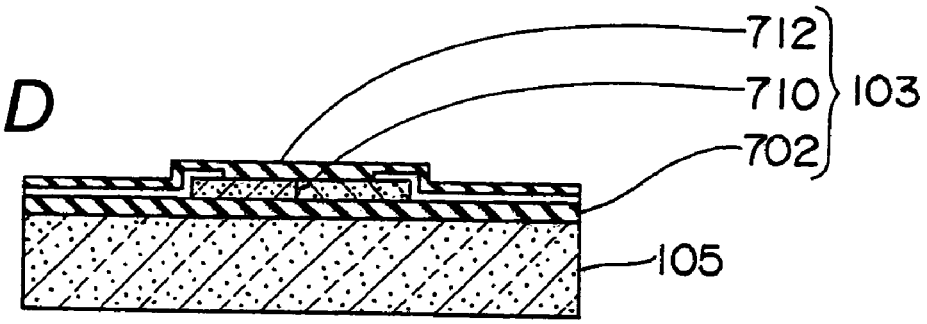

When employing an SOI substrate in which a mono-crystalline silicon thin film is formed onto the mono-crystalline silicon substrate with an insulating thin film being interposed between, the temperature sensor 103 may be formed as illustrated in FIG. 7A to 7D. As illustrated in FIG. 7A, an SOI substrate 706 with a mono-crystalline silicon thin film 704 being formed on the mono-crystalline silicon substrate 105 with an insulating thin film 702 being interposed between is prepared, and after removing through etching the mono-crystalline silicon thin film 704 such that portions forming the p-n junction diodes are remaining, p-type or n-type impurities are doped for forming p-type regions 704a and n-type regions 704b as illustrated in FIG. 7B. Next, as illustrated in FIG. 7C, electrodes 708 are formed in each of the p-type regions 704a and n-type regions 704b so as to comprise p-n junction diodes 710. Then, as illustrated in FIG. 7D, the temperature sensor 103 may be completed by covering the p-n junction diodes 710 with an insulating material 712 such as $SiO_2$ or SiN.

During these processes, as illustrated in FIG. 6A, supporting leg holding portions 102b that serve as pillars for supporting the heat-insulating supporting legs 102 that are formed above the temperature sensor 103 are further formed proximate to the temperature sensor 103. When using an SOI substrate, the supporting leg holding portions 102 may be formed onto an insulating thin film that has been exposed upon removing the mono-crystalline silicon thin film of the SOI substrate, or onto an insulating film layer formed by performing oxidation of the mono-crystalline silicon thin film, or directly onto the mono-crystalline silicon substrate that has been exposed upon removing the mono-crystalline silicon thin film and the insulating thin film. The supporting leg holding portions 102b may consist of $SiO_2$ or SiN.

During the processes as illustrated in FIG. 6A, it is also desirable to simultaneously form transistors of a signal read-out circuit for reading out signals from the temperature sensor. Especially, when employing an SOI substrate, it is preferable that at least transistors that determines bias voltage applied to the temperature sensor and/or transistors that perform analogous operation upon passing of output signals of the temperature sensor are formed onto the mono-crystalline silicon substrate that has been exposed upon removing the mono-crystalline silicon thin film and the insulating thin film of the SOI substrate. With this arrangement, such problems as a low breaking voltage or kink phenomena may be solved.

Figure 6B:
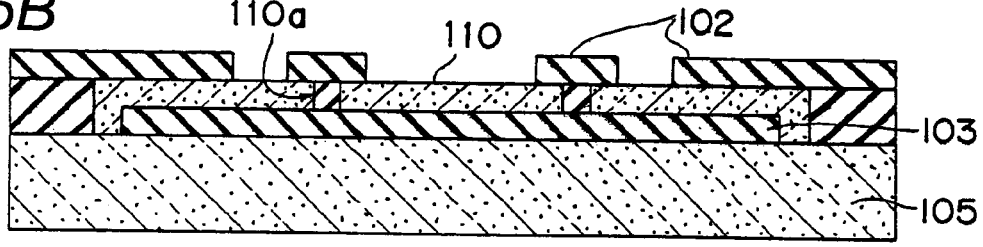

Next, a sacrifice layer 110 (i.e., first sacrifice layer) and the heat-insulating supporting legs 102 are sequentially formed as illustrated in FIG. 6B. While organic materials such as resist or polyimide or silicon formed through spattering or CVD method are suitable as the sacrifice layer 110, any material may be used as long as it exhibits etching selectivity with respect to the component member of the topmost surface of the temperature sensor 103 or the heat-insulating supporting legs 102 which are generally made of $SiO_2$. The sacrifice layer 110 is formed to be in contact with the mono-crystalline silicon substrate 105 around the temperature sensor 103 while covering the temperature sensor 103. It is preferable that the sacrifice layer 110 and the mono-crystalline silicon substrate 105 are in contact with each other around the temperature sensor 103, because a cavity is to be formed during sacrifice layer removing processes, which will be performed in a later step, by removing the substrate 105 downward of the temperature sensor 103.

After forming the sacrifice layer 110, holes 110a are formed by removing a part thereof so as to expose contact portions at two locations of the temperature sensor 103. The heat-insulating supporting legs 102 are then formed onto the sacrifice layer 110. The heat-insulating supporting legs 102 are also of an arrangement in which the wirings formed of metal, metal compound or semiconductor on the thin film are covered with an insulating material such as $SiO_2$. The wirings of the heat-insulating supporting legs 102 are in electric contact with the diodes of the temperature sensor 103 via the holes 11a formed in the sacrifice layer 110. It should be noted the insulating material such as $SiO_2$ is omitted as long as etching selectivity of the legs 102 with respect to the sacrifice layer 110 is existed. In such a case, the number of component members for the detector may be reduced and the sensitivity of the detector is increased owing to improvement in thermal resistance of the heat-insulating supporting legs.

Figure 6C:
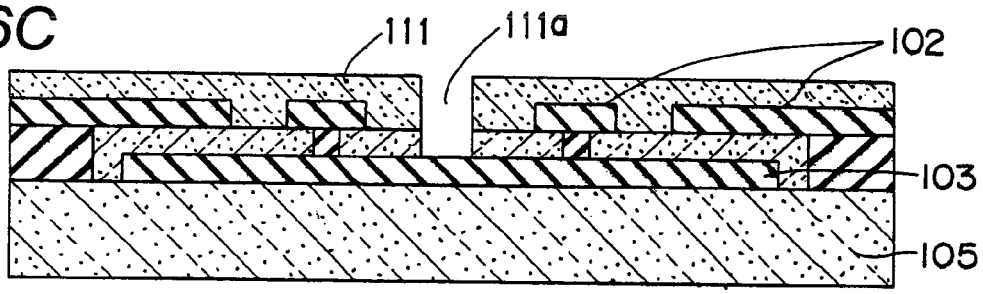

Next, as illustrated in FIG. 6C, a sacrifice layer 111 (i.e., a second sacrifice layer) is formed to cover the heat-insulating supporting legs 102 and to contact the sacrifice layer 110. While the sacrifice layer 111 may be formed of the same material as the sacrifice layer 110, it may also be of a material different from that of the sacrifice layer 110 as long as the material exhibits etching selectivity with respect to the material of the surface of the temperature sensor 103 or the heat-insulating supporting legs 102. A via hole 111a piercing through the sacrifice layer 110 and the sacrifice layer 111 and reaching the temperature sensor 103 is then formed.

Figure 6D:
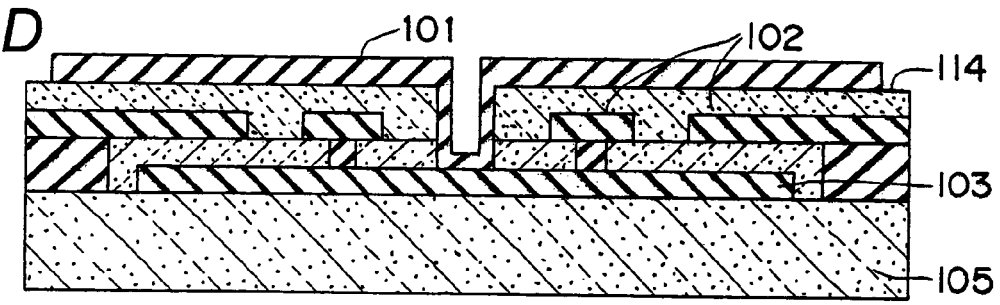

Then, as illustrated in FIG. 6D, the infrared absorption portion 101 is formed on the sacrifice layer 111. The infrared absorption portion 101 has an arrangement in which the infrared absorption film comprised of a metal or metal compound thin film is covered by an insulating material such as $SiO_2$. An etching hole 114 for exposing the sacrifice layer 111 is made beside of the infrared absorption portion 101. It should be noted that when employing a structure as illustrated in FIG. 17, the infrared absorption portion 101 is formed after forming an intermediate layer 116 within the via hole 111a. Forming of the intermediate layer 116 may be performed prior to the sacrifice layer 111 and simultaneously with the heat-insulating supporting legs 102.

Figure 6E:
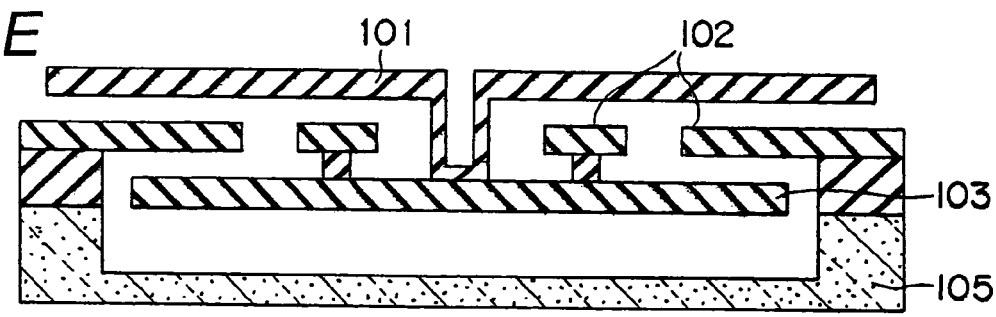

Thereafter, as illustrated in FIG. 6E, the sacrifice layer 110, the sacrifice layer 111, and the portion of the silicon substrate 105 under the temperature sensor 103 are etched through the etching hole 114 by using suitable etchants or etching reactant gas. When the sacrifice layers 110 and 111 are made of organic materials, it is possible to employ ashing treatment for etching the sacrifice layers. For etching sacrifice layers 110 and 111 made of silicon and for etching the silicon substrate 105, etching gas such as xenon fluoride or etchants such as TMAH or KOH may be employed. In this manner, the thermal type infrared detector of the arrangement as illustrated in FIG. 1 may be manufactured.

Embodiment 2

In embodiment 2, p-n junction diodes of vertical arrangement are employed as the temperature sensor 103. The remaining points are identical to those of Embodiment 1.

Figure 8:
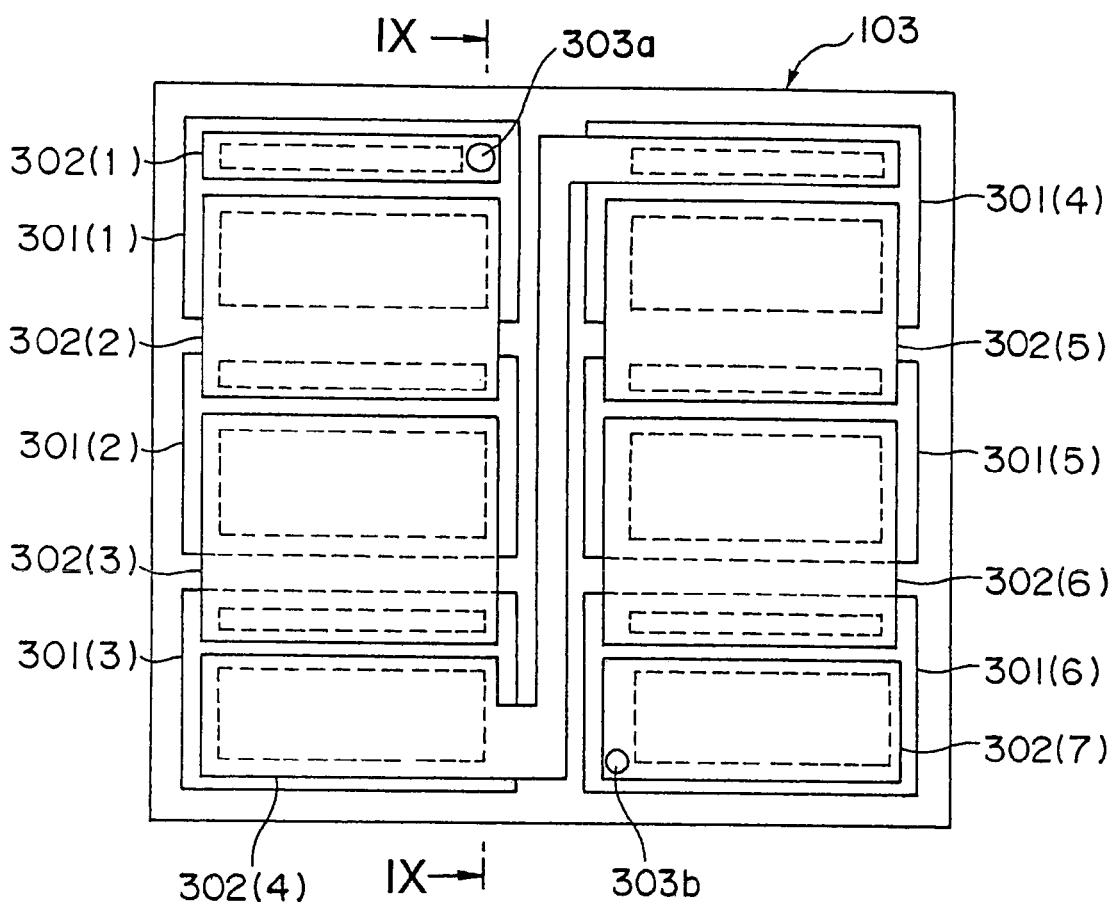
FIG. 8 is a plan view illustrating a temperature sensor of a thermal type infrared detector according to a second embodiment of the present invention.
Figure 9:
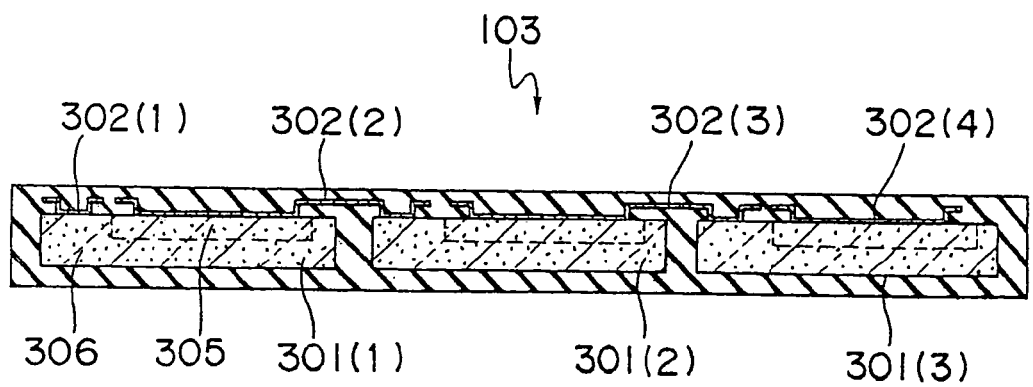
FIG. 9 is a cross-sectional view seen from section IX—IX in FIG. 8.

FIG. 8 is a plan view of a temperature sensor 103 employing p-n junction diodes of vertical arrangement, and FIG. 9 is a cross-sectional view seen from section A–A' in FIG. 8. Similar to Embodiment 1, six p-n junction diodes 301(1) to 301. (6) (hereinafter generally referred to as "diodes 301") are arranged in two rows, by threes on each side. The respective p-n junction diodes 301 are serially connected by using seven wiring electrodes 302(1) to 302(7) (hereinafter generally referred to as "wiring electrodes 302"). The fourth wiring electrode 302(4) is arranged in a crank-like manner that crosses the center of the rectangular detector for connecting the last diode 301(3) in the first row with the first diode 301(4) in the second row. The first wiring electrode 302(1) and the last wiring electrode 302(7) are respectively formed with contact portions 303*a* and 303*b* for connection with the heat-insulating supporting legs 102.

As illustrated in FIG. 9, the p-n junction diodes 301 of the present embodiment are of vertical arrangement in which p-type regions 305 and n-type regions 306 are joined in vertical directions of the substrate. Such an arrangement may be obtained by injecting p-type impurities to the n-type silicon layers. It is desirable that the temperature sensor 103 employed in a thermal type infrared detector is made of a film that is as thin as possible since the sensitivity to infrared rays or response speed are degraded when the thermal capacity is too large. For instance, the temperature sensor 103 should desirably have a thickness that is not more than 1 $\mu$m in maximum. However, when using p-n junction diodes of lateral arrangement as illustrated in Embodiment 1, it will be difficult to secure a sufficient p-n junction area when the temperature sensor 103 is thinned since the area of p-n junction is dependent on the thickness of the temperature sensor 103. In contrast thereto, by employing p-n junction diodes of vertical arrangement as in the present embodiment, it is possible to secure a sufficient area for p-n junction irrespective of the thickness of the temperature sensor 103, and it is thus suitable for achieving high sensitivity and low noise. It should be noted that it is desirable to increase the dopant density of the contact region of the wiring electrodes 302 and the semiconductor layers 301 to such a degree that favorable ohmic contact may be formed.

Embodiment 3

In embodiment 3, Schottky diodes are used as the temperature sensor 103. The remaining points are identical to those of Embodiments 1 or 2.

Figure 10:
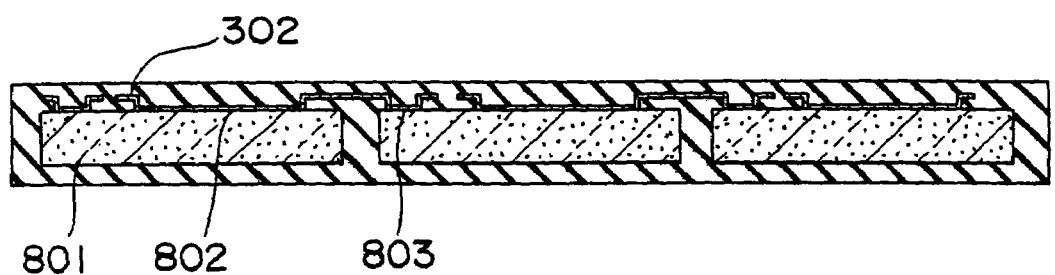
FIG. 10 is a cross-sectional view illustrating a temperature sensor of a thermal type infrared detector according to a third embodiment of the present invention.

FIG. 10 illustrates a cross-sectional view of the temperature sensor employing Schottky diodes. The arrangement of FIG. 10 corresponds to the p-n junction diodes as explained with reference to FIG. 9 in which the p-type regions 305 are not formed (in which no p-n junction is present). In the arrangement as illustrated in FIG. 10, upon suitably selecting a dopant density for an n-type silicon layer 801 and a material for the wiring electrodes 302 from among metal or metallic silicide, it is possible to form Schottky diodes on an interface between the n-type silicon layer 801 and the wiring electrodes 302. When a plurality of n-type silicon layers 801 are serially connected to the wiring electrodes 302, two interfaces 802 and 803 will be formed between the respective n-type silicon layers 801 and the wiring electrodes 302, each of which comprises a Schottky diode. The Schottky diode formed on the interface 803 on the input side will be of forward bias and the Schottky diode formed on the interface 802 on the output side will be of reverse bias. In both of the bias directions, the current-voltage characteristics of the Schottky diodes will be changed depending on the temperature so that it is possible to use them as a temperature sensor. It should be noted that the silicon layers 801 might also be p-type layers.

When employing Schottky diodes as the temperature sensor, manufacture of the temperature sensor will become simple since, contrary to p-n junction type diodes, it will be suffice when a semiconductor layer of either conductive type is formed. Since Schottky junctions are formed on interfaces between semiconductor layers and wiring electrodes, it is possible to secure a sufficient junction area upon thinning of the semiconductor layers. This leads to an advantage that the sensitivity may be improved without degrading the response speed. Since it is further possible to adjust the potential barrier height of Schottky junction by suitably selecting types of the wiring electrodes 302 and the dopant density for the semiconductor layers 801, the electric characteristics of the temperature may be easily adjusted.

In the present embodiment, it is desirable to use metal such as Ti, Co or Pt or a multi-layered film containing these materials as the wiring electrodes 302. It should be noted that if only one of the forward bias and reverse bias Schottky diodes is used, the semiconductor layer-wiring electrode interface of the other Shottky diode might be of ohmic contact. In this case, the semiconductor layer near the interface that is to be of ohmic contact shall exhibit a dopant density of such a degree that favorable ohmic contact can be formed.

Embodiment 4

In embodiment 4, p-n junction diodes and Schottky diodes are combined to form the temperature sensor 103. The remaining points are identical to those of Embodiments 1 to 3.

Figure 11:
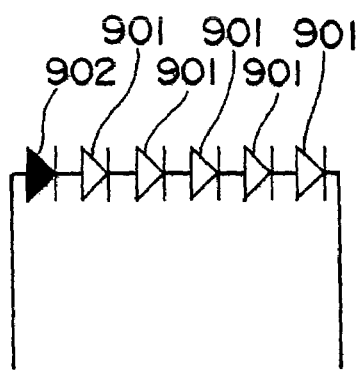
FIG. 11 illustrates an electric circuit of a temperature sensor of a thermal type infrared detector according to a fourth embodiment of the present invention.
Figure 12:
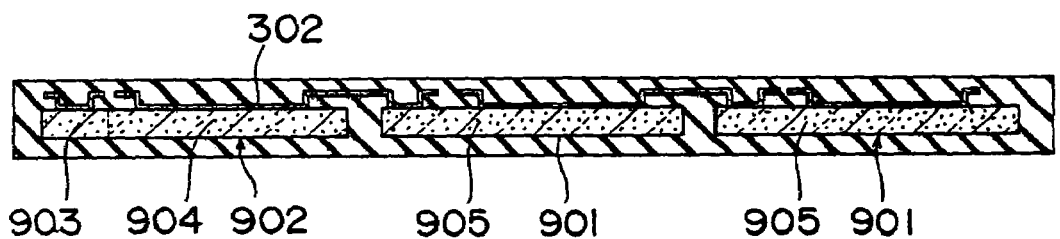
FIG. 12 is a cross-sectional view illustrating the temperature sensor of the thermal type infrared detector according to the fourth embodiment of the present invention.

FIG. 11 illustrates an electric circuit of the temperature sensor of the present embodiment, and FIG. 12 is a cross-sectional view thereof. As illustrated in FIGS. 11 and 12, the present embodiment is arranged in that one p-n junction diode 902 and a plurality of Schottky diodes 901 are serially connected to form the temperature sensor. More particularly, in FIG. 12, a p-type region 903 and an n-type region 904 are formed on a first semiconductor layer to form the p-n junction diode 902, and the second and later semiconductor layers are arranged to be n-type regions to form the Schottky diodes 901. By employing such an arrangement, the detectors themselves may favorably function as switches for read-out control in an infrared focal plane array.

More particularly, thermal type infrared detectors formed of diodes are two-dimensionally arranged to form an infrared focal plane array, a rectification effect of the diodes may be utilized to make the diodes themselves function as switches. In this case, there will be no need to form transistors or other switches for read-out control in the detector pixels, and the arrangement of the infrared focal plane array may be advantageously simplified. However, since Schottky diodes tend to be leaky in a reverse direction, their switching characteristics are insufficient to be used alone as switches. By intermixing one p-n junction diode with Schottky diodes, favorable Switching characteristics may be secured. In this manner, no considerations need to be made to rectification of Schottky diodes, and the degree of freedom of processes is accordingly increased.

Embodiment 5

In embodiment 5, p-n junction diodes of lateral arrangement different from that of Embodiment 1 are used as the temperature sensor. The remaining points are identical to those of Embodiment 1.

Figure 13:
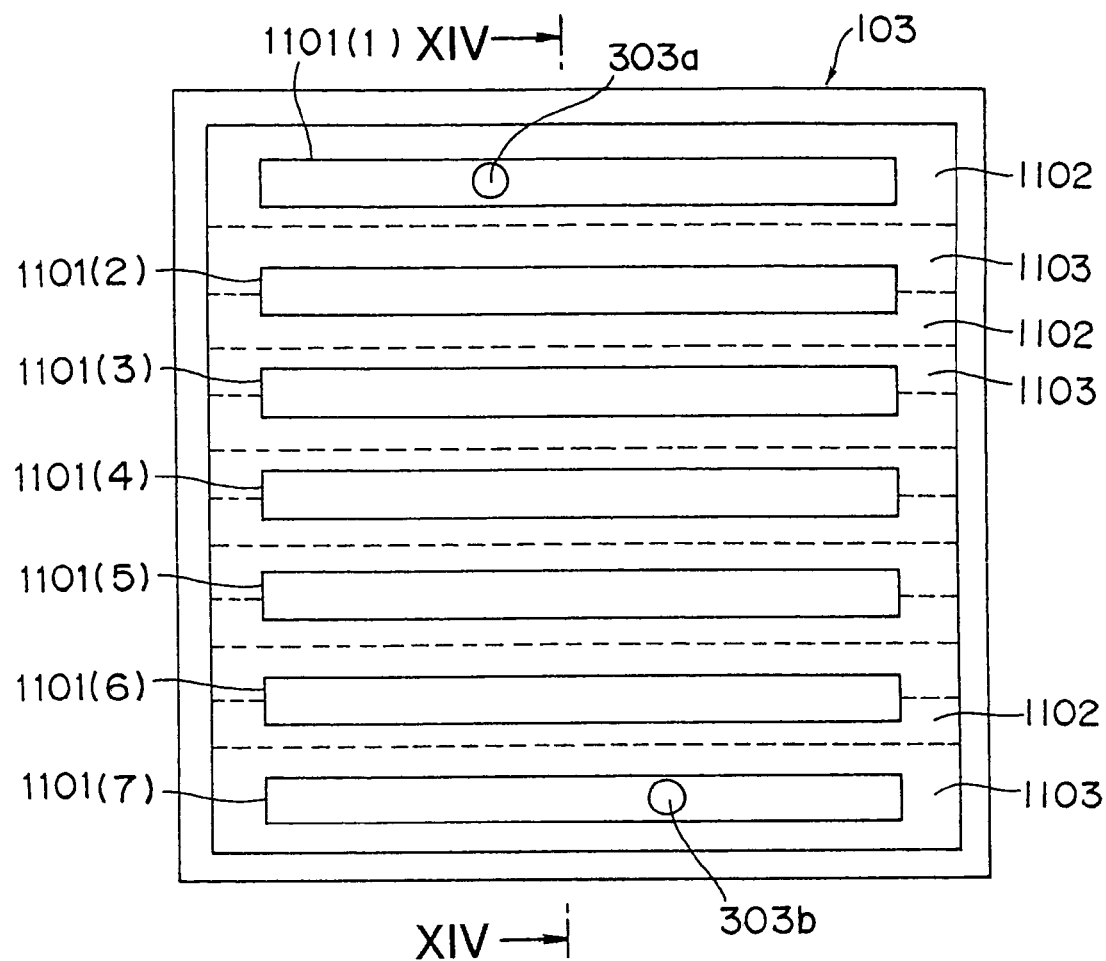
FIG. 13 is a plan view illustrating a temperature sensor of a thermal type infrared detector according to a fifth embodiment of the present invention.
Figure 14:
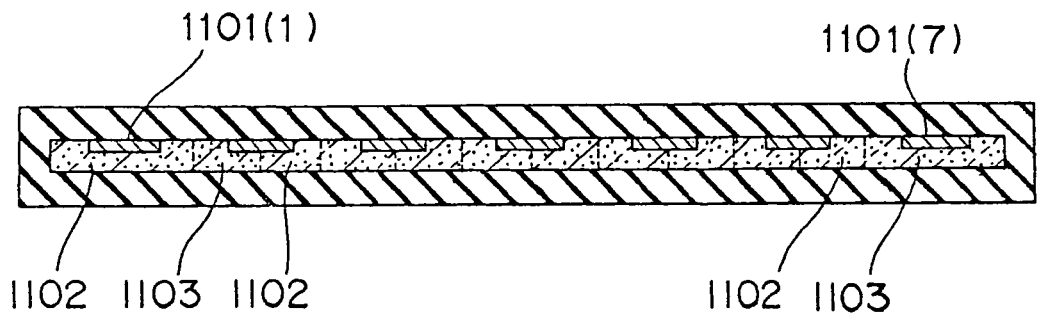
FIG. 14 is a cross-sectional view seen from section XIV—XIV in FIG. 13.

FIG. 13 is a plan view illustrating the temperature sensor 103 of the present embodiment, and FIG. 14 is a cross-sectional view seen from section A–A' in FIG. 13. In the present embodiment, six p-type regions 1102 and six n-type regions 1103 are alternately formed in a stripe-like manner in the interior of a single semiconductor layer, and six p-n junction of forward bias direction and six p-n junctions of reverse bias direction are formed on interfaces at which the p-type regions 1102 and the n-type regions 1103 contact. When using temperature changes in forward bias p-n junctions from among this arrangement, the p-n junctions of reverse bias are short-circuited through wirings. The seven wiring electrodes 1101(1) to 1101(7) (hereinafter generally referred to as "wiring electrodes 1101") are used as ohmic electrodes and also as short-circuiting wirings for p-n junction diodes. More specifically, the second to sixth wiring electrodes 1101(2) to 1101(6) are embedded into portions of p-n junctions of reverse bias direction so as to bridge between n-type regions 1103 and p-type regions 1102. With this arrangement, wiring electrodes 1101(2) to 1101(6) may function as ohmic electrodes and also as short-circuiting wirings for p-n junction diodes.

Metal or metal silicides may be used for forming the wiring electrodes 1101. It is desirable to use Ti, Co, Pt or suicides thereof as the metal or the metal suicide. By employing the lateral arrangement of the present embodiment, unneeded spaces between p-n junction diodes are eliminated and the number of connection of p-n junction diodes may be increased. Accordingly, the total area of p-n junction may be broaden, and the noise level can be lowered.

Embodiment 6

Figure 15:
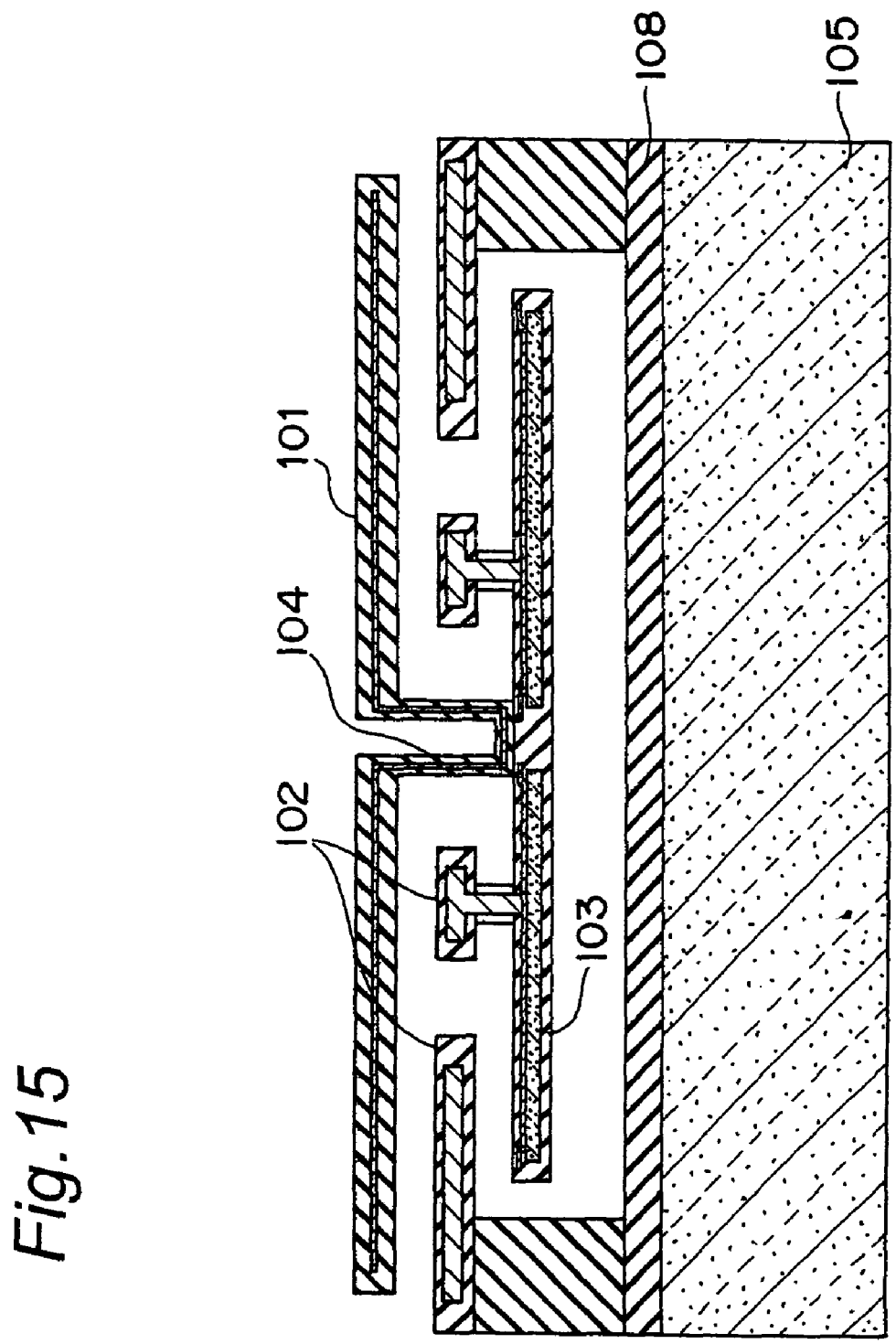
FIG. 15 is a plan view illustrating a thermal type infrared detector according to a sixth embodiment of the present invention.

While Embodiment 1 has showed an arrangement in which the portion of substrate 105 under the temperature sensor 103 is removed through etching for forming a cavity, it is also possible to employ an arrangement as illustrated in FIG. 15 in which the substrate 105 is not etched but in which the temperature sensor 103 is held over the substrate 105 by the heat-insulating supporting legs 102. In the arrangement as illustrated in FIG. 15, an SOI substrate cannot be employed. Therefore, it is necessary to grow another silicon layer on the substrate 105 for forming the temperature sensor 103. It is possible, for example, to form the silicon layer through spattering or CVD (chemical vapor deposition) method. Since the silicon layer will be polycrystal in this case, the noise is more likely to be generated when compared to a case in which an SOI substrate is employed. However, it will be of advantage in view of manufacturing costs since no expensive SOI substrate is required.

The method for manufacturing the thermal type infrared detector as illustrated in FIG. 15 will now be explained.

FIGS. 16A to 16E illustrates a method for manufacturing the thermal type infrared detector of FIG. 15. In FIG. 16, the internal arrangements of the temperature sensor 103, the heat-insulating supporting legs 102 and the infrared absorption portion 101 are omitted for simplification of the drawings. In the following method of manufacture, processes that are not particularly explained are identical to those as explained in Embodiment 1.

Figure 16A:
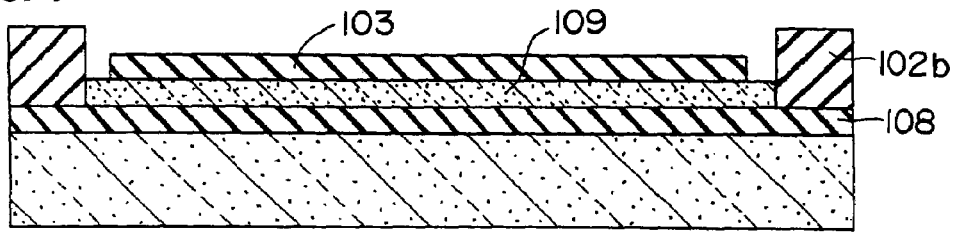
FIG. 16A to FIG. 16E illustrates a process for manufacturing the thermal type infrared detector in the first embodiment of the present invention.

As illustrated in FIG. 16A, an insulating film 108 made of $SiO_2$ or SiN is first formed on substantially the entire surface of the mono-crystalline silicon substrate 105. It should be noted that the insulating film 108 is not necessary where a sacrifice layer to be formed in a later step is made of a material that may be selectively etched from silicon. The sacrifice layer 109 (i.e., a first sacrifice layer) is formed on the insulating film 108 and The temperature sensor 103 is formed on the sacrifice layer 109. The sacrifice layer 109 may be made of the same material as the sacrifice layers 110 and 111 as explained in Embodiment 1. Supporting leg holding portions 102b that are to serve as pillars for supporting legs 102 are formed near the temperature sensor 103.

Figure 16B:
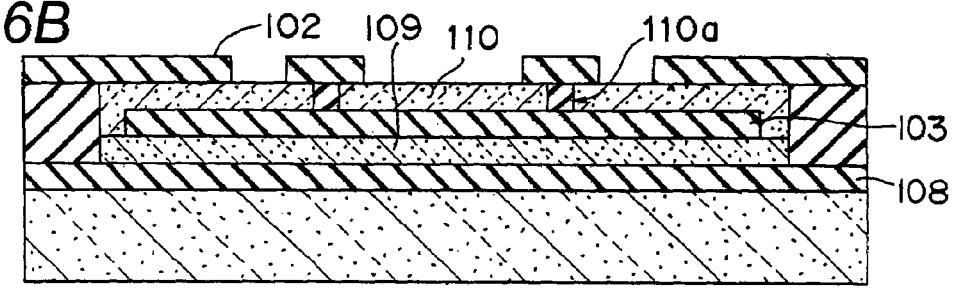

Then, as illustrated in FIG. 16B, the sacrifice layer 110 (i.e., the second sacrifice layer) and the heat-insulating supporting legs 102 are sequentially formed. The sacrifice layer 110 is formed to have contact with the sacrifice layer 109 around the temperature sensor 103 while covering the temperature sensor 103. The sacrifice layer 110 and the sacrifice layer 109 are preferably in contact with each other around the temperature sensor 103. This enables to form a cavity by removing the sacrifice layer 109 under the temperature sensor 103 during sacrifice layer removing processes that will be performed in a later step.

After forming the sacrifice layer 110, holes 110a are formed by removing a part thereof so as to expose contact portions at two locations of the temperature sensor 103. Then, the heat-insulating supporting legs 102 are formed onto the sacrifice layer 110. The wirings of the heat-insulating supporting legs 102 are contacted electrically with the diodes of the temperature sensor 103 via the holes 110a formed in the sacrifice layer 110.

Figure 16C:
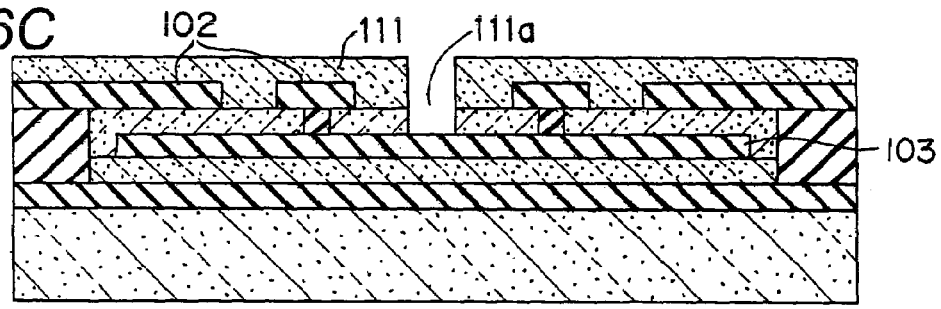

Thereafter, as illustrated in FIG. 16C, a sacrifice layer 111 (i.e., a third sacrifice layer) is formed to cover the heat-insulating supporting legs 102 and to have contact with the sacrifice layer 110. A via hole 111a piercing through the sacrifice layer 110 and the sacrifice layer 111 and reaching the temperature sensor 103 is then formed.

Figure 16D:
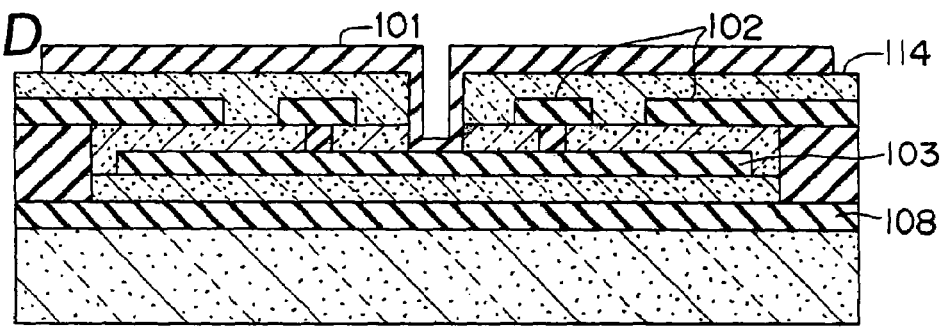

Then, as illustrated in FIG. 16D, the infrared absorption portion 101 is formed on the sacrifice layer 111. An etching hole 114 for exposing the sacrifice layer 111 is made beside of the infrared absorption portion 101. It should be noted that when employing a structure as illustrated in FIG. 17, the infrared absorption portion 101 is formed after forming an intermediate layer 116 within the via hole 111a. Forming of the intermediate layer 116 may be performed prior to the sacrifice layer 111 and simultaneously with the heat-insulating supporting legs 102.

Figure 16E:
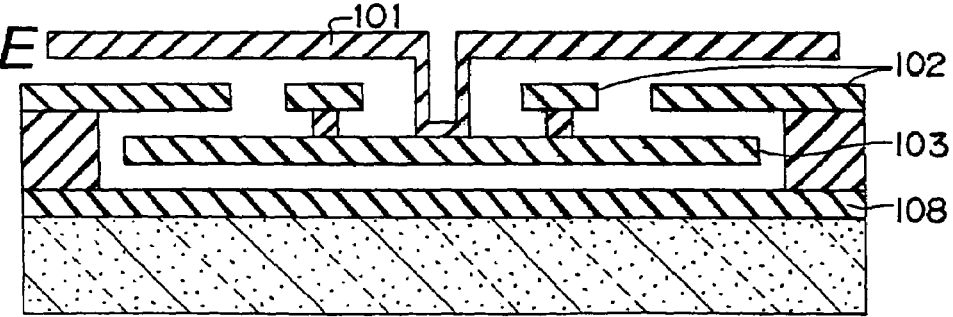

Thereafter, as illustrated in FIG. 16E, the sacrifice layer 111, the sacrifice layer 110 and the sacrifice layer 109 under the temperature sensor 103 are etched through the etching hole 114 by using suitable etchants or etching reactant gas. When the sacrifice layers 109, 110 and 111 are made of organic materials, it is possible to perform ashing treatment for etching the sacrifice layers. When silicon is employed as the sacrifice layers 109, 110 and 111, etching gas such as xenon fluoride or etchants such as TMAH or KOH may be employed. While the sacrifice layers 109, 110 and 111 may be formed of the same material, they may also be of mutually different materials as long as the materials exhibit etching selectivity with respect to the material of the surface of the temperature sensor 103 or the heat-insulating supporting legs 102. The thermal type infrared detector as illustrated in FIG. 15 may be manufactured in this manner. While this method requires three-layered sacrifice layers, the basic processes will be identical to those of Embodiment 1.

While diodes have been employed as the temperature sensors so far, any member of which electric characteristics change through temperature may be employed. Also, it is possible to employ bipolar transistors, junction field effect transistors, MOS transistors or resistance bolometers etc. The above-described relation between 1/f noise and the size of the temperature sensor generally holds not only when diodes are used as the temperature sensors but also for all types of temperature sensors. It is accordingly possible to achieve low noise of infrared detecting signals by applying the present invention.

Embodiment 7

In embodiment 7, an exemplary arrangement of an infrared focal plane array will be described in which the thermal type infrared detectors according to the present invention are two-dimensionally arranged. Applying the present invention to an infrared focal plane array is extremely effective in improving the performance of the focal plane array since each of the infrared detectors are to be formed in a limited area.

Figure 18:
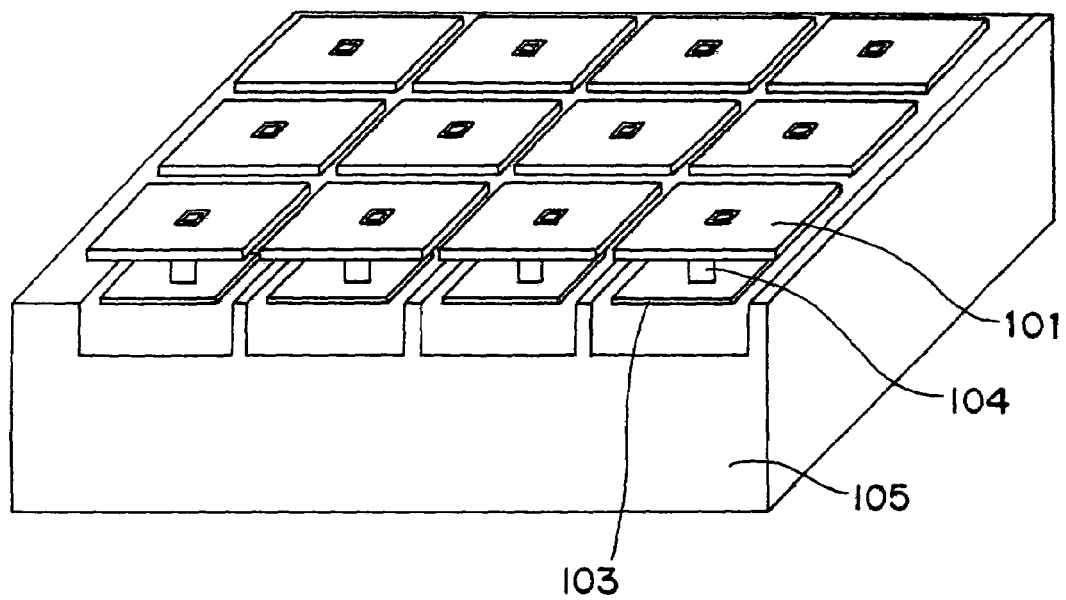
FIG. 18 is a perspective view illustrating an infrared focal plane array according to a seventh embodiment of the present invention.

FIG. 18 is a perspective view schematically illustrating an infrared focal plane array employing the thermal type infrared detectors of the present invention. There are formed, in a matrix-like arrangement, thermal type infrared detectors 10 comprising the temperature sensor 103 and the infrared absorption portion 101 on the semiconductor substrate 105 of mono-crystalline silicon. The signal read-out circuit (not shown) is formed on the mono-crystalline silicon substrate 105 in the periphery of the thermal type infrared detectors 10.

Figure 19:
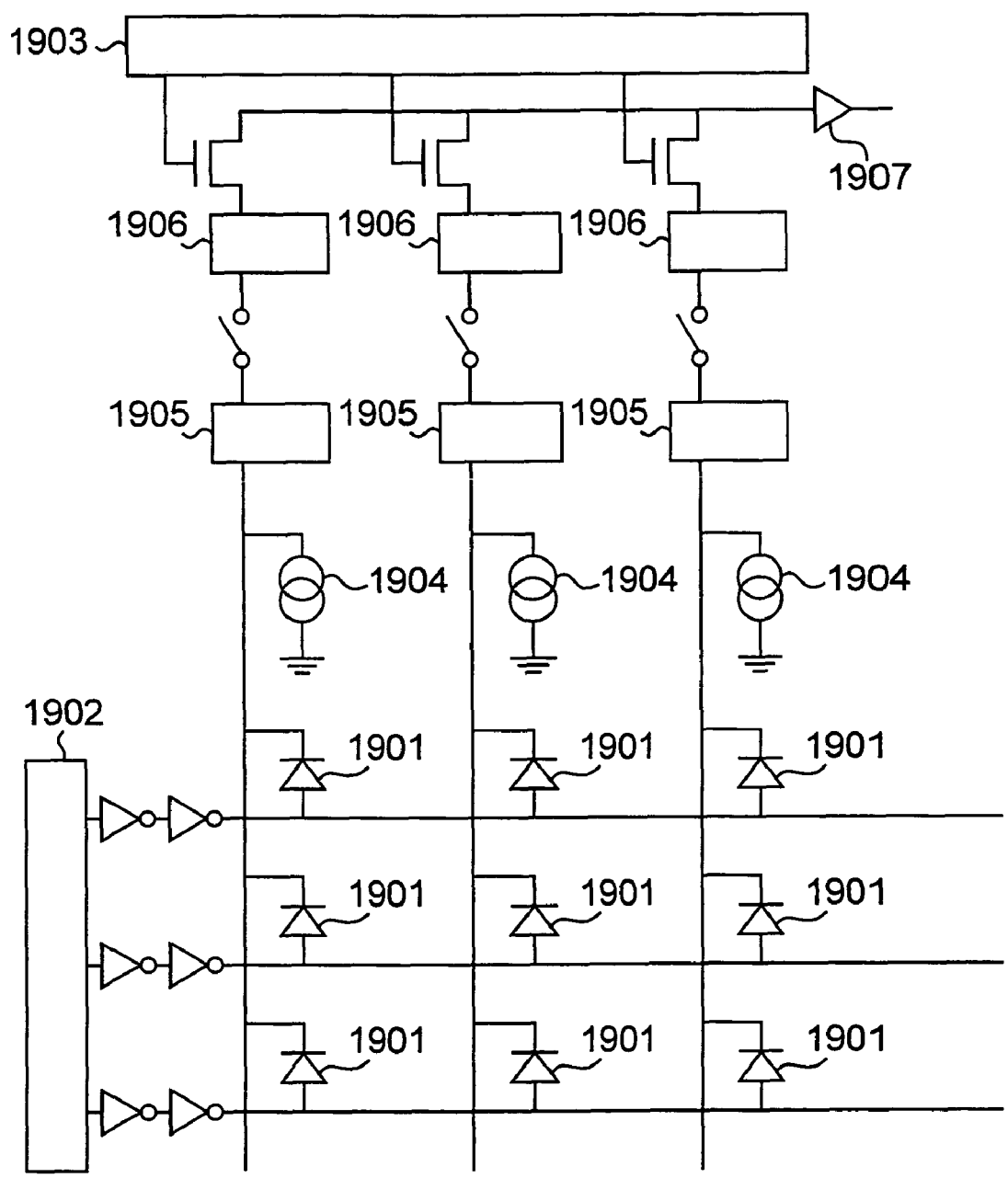
FIG. 19 illustrates an electric circuit of the infrared focal plane array according to the seventh embodiment of the present invention.

FIG. 19 illustrates an electric circuit of the infrared focal plane array employing the thermal type infrared detectors of the present invention. It should be noted that the diodes, which serve as the temperature sensors of the thermal type infrared detectors, are represented as a single diode 1901 for simplifying the drawing. The diodes 1901 are driven at stationary current by applying forward bias through a current source 1904. Since voltage generated at both ends of the diodes 1901 exhibits temperature dependency, it is possible to employ such voltage as the temperature sensors.

Diodes 1901 of respective pixels are selected and activated row by row through a vertical scanning circuit (i.e., signal line selecting circuit) 1902. There are no active elements in the respective pixels other than the diodes 1901 that may function as switches. However, it is possible to prevent interference with active pixels of selected rows since the non-selected diodes 1901 will be under a reverse-bias condition.

Voltages generated at both ends of the diodes 1901 are entered to an integrating circuit 1905. In the integrating circuit 1905, signals of the respective pixels are integrated with the selected period. This effectively limit noise bandwidths and reduces the noise. The integrating circuit 1905 may also exhibit amplifying actions. Signals that have been integrated in the integrating circuit 1905 are accumulated in a hold circuit 1906 and sequentially read out by a horizontal scanning circuit (i.e., signal line selecting circuit) 1903 in a pixel-by-pixel manner. Such signals are amplified in an amplifier 1907 and are output as pixel signals.

Embodiment 8

Figure 20:
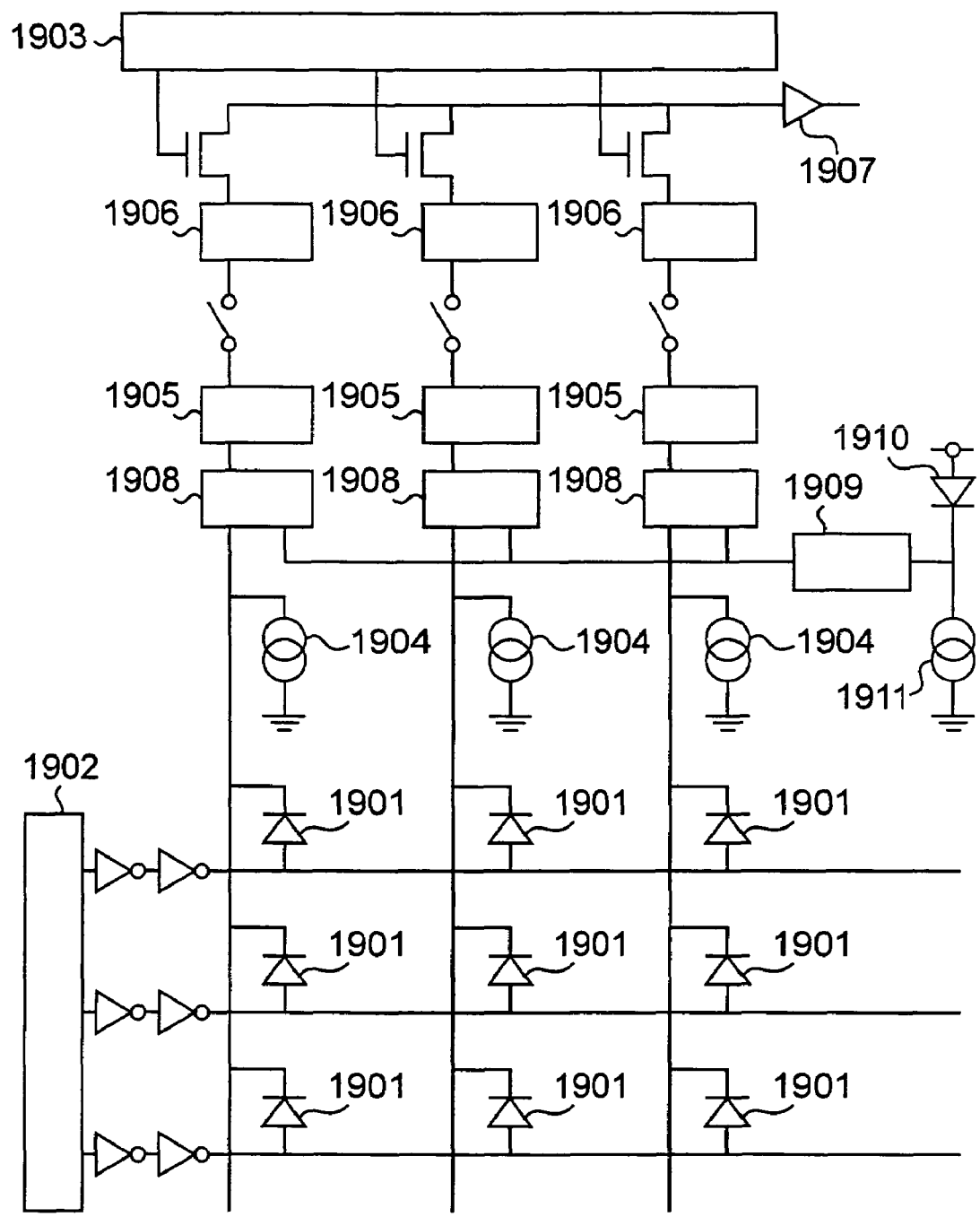
FIG. 20 illustrates an electric circuit of the infrared focal plane array according to an eighth embodiment of the present invention.

FIG. 20 illustrates an electric circuit of an infrared focal plane array with a different circuit arrangement. The infrared focal plane array according to the present invention is identical to that of Embodiment 7 except for the points that will be explained hereinafter.

In the infrared focal plane array of the present embodiment, a differential input circuit 1908 is disposed before the integrator 1905. Signals from the respective pixels of the temperature sensors 1901 and signals from reference temperature sensor 1910 disposed separately from the pixels enters into the differential input circuit 1908 similarly to the diodes 1901 of the pixels, the reference temperature sensors 1910 are driven by a current source 1911. Changes in electric characteristics of the reference temperature sensors 1910 owing to temperature changes are substantially identical to those of the pixels 1901, but exhibit substantially no sensitivity to incident infrared rays. In other words, the reference temperature sensors 1910 only detect changes in temperature of the environment. By obtaining differentials between end-to-end voltages of the pixel diodes 1901 and signals from the reference temperature sensor, an undesirable signal change due to temperature change of the environment may be eliminated from the signals of the pixel diodes 1901.

In order to make the reference temperature sensors 1910 be non-sensitive to incident infrared rays, a heat-insulating structure or an infrared absorbing structure may be omitted from the reference temperature sensors 1910. It should be noted that the reference temperature sensor 1910 are not necessarily the same as the pixels. For example, a plurality of temperature sensors each of which has similar structure as those of the pixels may be connected to form a reference temperature sensor. When the number of the connected sensors in the reference temperature sensor is "n" (wherein n is a natural number), the current value of the current source 1911 should be set n-times larger than that of the current source 1904. In this case, signals from the reference temperature sensor will be of low noise by an averaging effect, and the S/N characteristics of the focal plane array is improved.

A filter circuit 1909 may be provided between the reference temperature sensor 1910 and the differential input circuit 1908 to reduce noise. This reduces noise level of signals that enters into the differential input circuit 1908 and improves S/N characteristics of the focal plane array.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be constructed as being included therein.

What is claimed is:

1. A thermal infrared detector comprising:
   a substrate;
   a temperature sensor having electrical characteristics that change in response to a temperature change caused by absorption of infrared rays;
   heat-insulating supporting legs supporting and thermally insulating said temperature sensor and including signal lines for reading out electrical signals from said temperature sensor; and
   an infrared absorption layer in thermal contact with said temperature sensor, wherein
      said temperature sensor and said infrared absorption layer overlap said heat-insulating supporting legs when viewed along a direction of infrared rays incident on said infrared absorption layer, and
      each of said temperature sensor, said heat-insulating supporting legs, and said infrared absorption layer is located in a respective, different plane, and the planes are spatially separated from each other so that respective first and second cavities are located between said temperature sensor and said heat-insulating supporting legs and between said heat-insulating supporting legs and said infrared absorption layer.

2. The thermal infrared detector according to claim 1, wherein said temperature sensor and said infrared absorption layer cover substantially all of said heat-insulating supporting legs when viewed along the direction of infrared rays incident on said infrared absorption layer.

3. The thermal infrared detector according to claim 1, wherein said infrared absorption layer, said heat-insulating supporting legs, and said temperature sensor are laminated sequentially when viewed along the direction of infrared rays incident on said infrared absorption layer.

4. The thermal infrared detector according to claim 1, wherein said temperature sensor comprises a diode or a plurality of diodes that are serially connected.

5. An infrared focal plane array comprising a plurality of thermal infrared detectors according to claim 4, wherein said infrared detectors are arranged in a two-dimensional array, a forward bias voltage is applied so a constant current flows, and an end-to-end voltage generated by incident infrared rays in each of said infrared detectors is read out as an image signal.

6. The infrared focal plane array according to claim 5, further comprising a reference temperature sensor and differential input circuits to which signals from both of said infrared detectors and said reference temperature sensor are applied, wherein said reference temperature sensor has a temperature-voltage characteristic substantially the same as those of said infrared detectors and is substantially insensitive to incident infrared rays.

7. The thermal infrared detector according to claim 1, wherein said temperature sensor comprises a transistor.

8. The thermal infrared detector according to claim 1, wherein said substrate includes a mono-crystalline silicon layer on an insulating thin film and said temperature sensor is in said mono-crystalline layer.

9. The thermal infrared detector according to claim 1, wherein said substrate opposite said temperature sensor is thinner than elsewhere.

10. The thermal infrared detector according to claim 1, wherein said temperature sensor comprises a bolometer film.

11. An infrared focal plane array comprising a plurality of thermal infrared detectors according to claim 1, wherein said infrared detectors are arranged in a two-dimensional array.

12. A method for manufacturing a thermal infrared detector comprising:
  forming a temperature sensor on a substrate, said temperature sensor having electrical characteristics changing in accordance with a change in temperature;
  forming a first sacrificial layer covering said temperature sensor and partially contacting said substrate;
  removing a portion of said first sacrificial layer to expose a portion of said temperature sensor;
  forming a wiring layer on said first sacrificial layer, said wiring layer being electrically connected to said temperature sensor at a portion not covered by said first sacrificial layer;
  forming a second sacrificial layer covering said wiring layer and contacting part of said first sacrificial layer;
  forming via holes by removing a part of said first and second sacrificial layers;
  forming an infrared absorbing layer on said second sacrificial layer so that said infrared absorbing layer contacts said temperature sensor through said via holes either directly or with an insulating layer interposed; and
  removing said second sacrificial layer, said first sacrificial layer, and a portion of said substrate opposite said temperature sensor to form a first cavity between said substrate and said temperature sensor, a second cavity between said temperature sensor and said wiring layer, and a third cavity between said wiring layer and said infrared absorbing layer.

13. A method for manufacturing a thermal infrared detector comprising:
  forming a first sacrificial layer on a substrate;
  forming a temperature sensor on said first sacrificial layer, said temperature sensor having electrical characteristics that change in accordance with changes in temperature;
  forming a second sacrificial layer covering said temperature sensor and partially contacting said first sacrificial layer;
  removing a portion of said second sacrificial layer to expose a portion of said temperature sensor;
  forming a wiring layer on said second sacrificial layer, said wiring layer being electrically connected to said temperature sensor at a portion not covered by said second sacrificial layer;
  forming a third sacrificial layer covering said wiring layer and contacting part of said second sacrificial layer;
  forming via holes by removing a part of said third and second sacrificial layers;
  forming an infrared absorbing layer on said third sacrificial layer and contacting said temperature sensor through said via holes either directly or with an insulating layer interposed; and
  removing said third sacrificial layer, said second sacrificial layer, and said first sacrificial layer to form a first cavity between said substrate and said temperature sensor, a second cavity between said temperature sensor and said wiring layer, and a third cavity between said wiring layer and said infrared absorbing layer.

* * * * *